(12) United States Patent
Uedo

(10) Patent No.: US 7,764,567 B2
(45) Date of Patent: *Jul. 27, 2010

(54) WORD LINE DRIVER CIRCUITRY AND METHODS FOR USING THE SAME

(75) Inventor: Hirokazu Uedo, Kobe (JP)

(73) Assignee: Micron Technology, Inc., Boise, IA (US)

(*) Notice: Subject to any disclaimer, the term of this patent is extended or adjusted under 35 U.S.C. 154(b) by 110 days.

This patent is subject to a terminal disclaimer.

(21) Appl. No.: 12/077,852

(22) Filed: Mar. 21, 2008

(65) Prior Publication Data

US 2008/0181025 A1    Jul. 31, 2008

Related U.S. Application Data

(60) Continuation of application No. 11/472,107, filed on Jun. 20, 2006, now Pat. No. 7,366,051, which is a division of application No. 10/971,939, filed on Oct. 22, 2004, now Pat. No. 7,269,091.

(30) Foreign Application Priority Data

Aug. 25, 2004    (JP) .............................. 2004-245954

(51) Int. Cl.
    *G11C 8/00*    (2006.01)
(52) U.S. Cl. ............................ 365/230.06; 365/189.11; 365/203; 365/185.23; 365/185.25
(58) Field of Classification Search ............ 365/230.06, 365/189.11, 203, 185.23, 185.25
    See application file for complete search history.

(56) References Cited

U.S. PATENT DOCUMENTS

| | | | |
|---|---|---|---|
| 4,661,927 A | 4/1987 | Graebel | |
| 4,747,083 A | 5/1988 | Nakajima et al. | |
| 4,905,192 A * | 2/1990 | Nogami et al. | 365/200 |
| 5,251,173 A | 10/1993 | Wong | |
| 5,255,240 A | 10/1993 | Wong | |
| 5,365,482 A | 11/1994 | Nakayama | |
| 5,495,454 A | 2/1996 | Fukuzo | |
| 5,557,580 A | 9/1996 | Numaga et al. | |
| 5,901,096 A * | 5/1999 | Inokuchi et al. | 365/201 |
| 5,923,609 A * | 7/1999 | Roscher et al. | 365/230.06 |
| 6,046,956 A | 4/2000 | Yabe et al. | |
| 6,049,495 A * | 4/2000 | Hsu et al. | 365/203 |
| RE36,842 E | 8/2000 | Arimoto et al. | |
| 6,104,665 A | 8/2000 | Hung et al. | |
| 6,147,914 A * | 11/2000 | Leung et al. | 365/189.09 |

(Continued)

FOREIGN PATENT DOCUMENTS

EP    130793    1/1985

*Primary Examiner*—Viet Q Nguyen
(74) *Attorney, Agent, or Firm*—Dorsey & Whitney LLP

(57) ABSTRACT

Word line driver circuitry for selectively, charging and discharging one or more word lines is provided. The driver circuitry uses a dual transistor topology, where a first transistor is driven by a signal, DOUT, and a second transistor is driven by a time-delayed complement of the DOUT, DOUT_BAR. The time delay prevents DOUT_BAR from changing its state immediately after DOUT changes state. As a result, both the first and second transistors are turned ON at the same time for a predetermined of time. It is during this time that the voltage on the word line is rapidly driven to a LOW voltage. When the second transistor turns OFF, high impedance circuitry limits the flow of leakage current. This minimizes leakage current when the word line is OFF and when short circuit conditions are present between two or more word lines or between a word line and a bit line.

36 Claims, 7 Drawing Sheets

U.S. PATENT DOCUMENTS

| | | |
|---|---|---|
| 6,337,831 B1 | 1/2002 | Nam et al. |
| 6,344,992 B1 | 2/2002 | Nakamura et al. |
| 6,545,923 B2 * | 4/2003 | Sim et al. .................. 365/204 |
| 6,731,564 B1 * | 5/2004 | Tran et al. ................... 365/229 |
| 6,751,135 B2 * | 6/2004 | Fischer et al. ............... 365/194 |
| 6,762,971 B2 | 7/2004 | Yamagami et al. |
| 6,809,986 B2 * | 10/2004 | Kim et al. ............. 365/230.06 |
| 6,816,401 B2 | 11/2004 | Kauffmann et al. |
| 6,909,660 B2 * | 6/2005 | Oh ............................ 365/229 |
| 6,925,025 B2 * | 8/2005 | Deng et al. ................. 365/226 |
| 6,961,282 B2 * | 11/2005 | Son ...................... 365/230.06 |
| 7,064,984 B2 * | 6/2006 | Pekny .................. 365/185.23 |
| 7,142,446 B2 * | 11/2006 | Derner et al. ............... 365/149 |
| 7,164,616 B2 * | 1/2007 | Miller et al. .......... 365/230.06 |
| 7,403,442 B2 * | 7/2008 | Larguier et al. ........ 365/230.06 |
| 2004/0160850 A1 | 8/2004 | Son |
| 2005/0052937 A1 * | 3/2005 | Matsuura ............... 365/230.06 |
| 2005/0219934 A1 | 10/2005 | Hanzawa et al. |

* cited by examiner

WORD LINE DRIVER CIRCUITRY AND METHODS FOR USING THE SAME

This is a continuation of U.S. patent application Ser. No. 11/472,107, filed Jun. 20, 2006, now U.S. Pat. No. 7,366,051 which is a divisional of U.S. patent application Ser. No. 10/971,939, filed Oct. 22, 2004, now U.S. Pat. No. 7,269,091, which claims priority from Japanese Application No. 2004-245954, filed Aug. 25, 2004. Each of these applications is hereby incorporated herein by reference in its entirety.

BACKGROUND OF THE INVENTION

The present invention relates to integrated circuitry, and in particular to word line driver circuitry for use in integrated circuitry such as memory.

Memory, such as dynamic random access memory (DRAM) and static random access memory (SRAM), typically include many memory cells that are capable of holding a charge that is representative of a bit of data. Typically, these memory cells are arranged in a two-dimensional array of intersecting rows and columns. Data is written to and retrieved from the memory cells by selectively accessing the memory cells.

Memory cells can be accessed by applying activation voltages to word lines and bit lines. In general, word lines activate memory cells and bit lines provide data to or retrieve data from the activated memory cells. Conventionally, a word line runs adjacent to each row of memory cells and a bit line runs adjacent to each column of memory cells. It is understood this arrangement is not fixed and that memory can be constructed such that word lines run adjacent to columns of memory cells and bits lines run adjacent to rows of memory cells.

When memory access is desired, an activation voltage is applied to the word line by a word line driver so that a desired function (e.g., read or write) is performed. More particularly, when an activation voltage is applied to the word line, this activates circuitry (e.g., passgate transistor) in the memory cell that enables a bit line to write data to or retrieve data from the activated memory cell. When memory access is not needed, the word line driver may apply a deactivation voltage to cease the memory access function.

These activation and deactivation voltages may be applied by word line drivers. For example, to write data to a memory cell or to read data from a memory cell, a word line may need to be driven to a positive voltage level. During periods of inactivity (i.e., no memory access is being performed), the voltage on the word lines may be driven to a low voltage such as a ground voltage or a negative voltage.

It is desirable to drive the word line to a negative voltage level or a ground voltage level when the memory cell is not being accessed to ensure that the memory cell does not loose its charge. However, driving the word line to such voltages creates problems such as bouncing. Bouncing is an undesirable voltage spike or ripple that occurs on the voltage source providing the ground or negative voltage when the voltage on a word line is being pulled down from an activation voltage. Deleterious effects of bouncing have been known to become more pronounced the faster the word line is pulled down.

Excessive leakage current is another problem that has proved difficult for conventional word line drivers to handle. Such excessive leakage current can be caused when adjacent rows of word lines short or when a word line short circuits with an overlapping bit line. These short circuits can cause excessive leakage current that can damage the memory circuitry, result in increased power consumption, or result in faulty memory operation.

Moreover, in conventional memory arrangements, the presence of a short circuit can render a whole segment (which may be connected to a common voltage source) of memory permanently inoperable. These segments typically constitute "large" blocks of memory within the memory array, (similar in the way a hard disk cluster is a "large" portion of hard drive space within a hard drive). Depending on the word line driver circuitry being implemented in the memory, failure of one word line can propagate and render an entire segment inoperable.

Such a failure, which can be caused by a short circuit condition, can occur when a word line fault test is being performed. A word line fault test tests whether a word line is faulty (e.g., short circuited). Conventional word line driver circuitry is unable to prevent the segment from becoming permanently inoperable in the event a word line fault test is performed on a faulty word line. Thus, when testing voltages are applied to a word line to test whether that word line is faulty, a faulty word line results in rendering not just the memory cells associated with that word line inoperable, but all the memory cells in that segment are rendered inoperable.

Therefore, it is an object of the invention to provide word line driver circuitry that provides rapid pull down, while providing protection against short circuit conditions.

SUMMARY OF THE INVENTION

This and other objects of the invention are provided by word line driver circuitry that utilizes a dual transistor arrangement to promote rapid pull down of a word line, while at the same time limiting leakage current when the word line is turned OFF.

Word line driver circuitry is provided that is operable to selectively drive the voltage of at least one word line between an activation voltage and a deactivation voltage. The word line driver circuitry includes a first transistor, a second transistor, high impedance circuitry, an inverter, and a delay stage. The first transistor is controlled by a signal provided by driver control circuitry (or other similar type of circuitry) and the second transistor is controlled by a time delayed complement (provided by the delay stage and inverter) of that signal. The inversion of the signal results in having the first transistor being turned ON while the second transistor is turned OFF, and vice versa. The time delay, however, ensures that both transistors are either turned ON or OFF, depending on the state (e.g., logic HIGH or LOW) of the signal, for a predetermined period of time.

During operation, the word line driver circuitry selects one of three current paths to drive the word line voltage HIGH and LOW and to limit leakage current. The selection of the current path depends on the state of the signal and the time delayed complement of that signal. For example, the word line driver circuitry may select a first path if the signal is LOW and its complement is HIGH, select a second path if the signal and its complement are both HIGH, and select a third path if the signal is HIGH and its complement is LOW.

When the state of the signal and its complement are HIGH, this causes both the first and second transistors to be turned ON simultaneously. This results in coupling the word line to a low voltage source via a low impedance pathway that results in rapid pull down of the word line voltage. Although this coupling is momentary, it is sufficiently long enough pull the voltage on the word line down to the deactivation voltage. That this momentary coupling is a predetermined period of time set by the delay stage.

An advantage of this dual transistor arrangement in the word line driver circuitry according to this invention is that the second transistor can be sized to ensure that the word line is pulled down to the deactivation voltage while both transistors are ON. Moreover, the flexibility in sizing the second transistor promotes other advantages such as rapidly pulling down the word line voltage without experiencing substantial bounce on the LOW voltage source. Yet other advantages include increased refresh rates for long rise low transitions and static transitions.

After the predetermined period of time expires, the second transistor turns OFF, while the first transistor remains ON. Once OFF, the second transistor acts like an "open" switch, thereby preventing current from flowing through the second transistor. An alternative path for current flow is provided by the high impedance circuitry, which couples the first transistor to the LOW voltage source. This high impedance circuitry is effective in limiting leakage current when the word line is deactivated and is also effective in protecting the memory cells from row-to-row shorts and row-to-column shorts.

When the state of the signal is LOW, the word line driver drives the word line to an activation voltage. The LOW signal causes the first transistor to turn OFF, creating an open "switch" that prevents the low voltage source from pulling the word line down. Once the first transistor is OFF, the word line is pulled HIGH by a high voltage source. Another advantage realized by the dual transistor arrangement is that when the word line is HIGH, leakage current is minimized because the first transistor is OFF.

Protection circuitry according to the invention can be used to protect one or more word lines from row-to-row shorts and row-to-column shorts. For example, in one embodiment, protection circuitry may be coupled to one word line driver. In another embodiment, protection circuitry may be coupled to multiple word line drivers. In the multiple word line driver embodiment, the protection circuitry may be driven by a GLOBAL signal.

Further features of the invention, its nature and various advantages will be more apparent from the accompanying drawings on the following detailed descriptions.

DETAILED DESCRIPTION OF THE INVENTION

Figure 1:
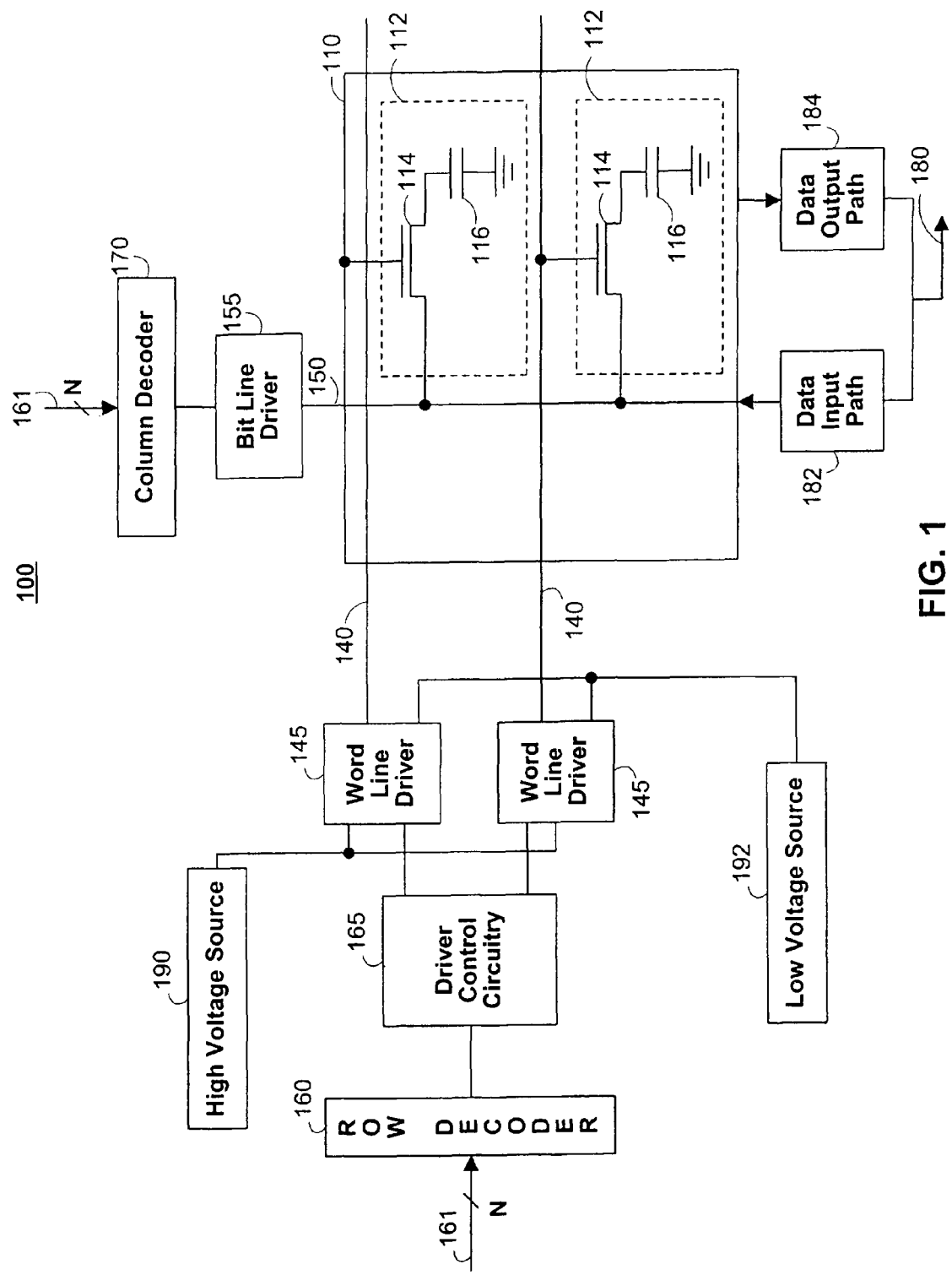
FIG. 1 is a schematic diagram of memory circuitry according to the invention.

FIG. 1 shows a memory device 100 having word line driver circuitry 145 according to the invention. FIG. 1 shows that device 100 includes a portion of memory circuitry 110 with two memory cells 112 arranged side-by-side. It is understood that memory circuitry 110 typically includes a plurality of memory cells arranged in rows and columns, but only two such memory cells are shown here for simplicity. Memory circuitry 110 includes word lines 140 and bit lines 150 that are disposed adjacent to the rows and columns of memory cells 112. It is understood that memory circuitry generally includes a plurality of word lines and bit lines, but only two word lines and one bit line are shown here for simplicity. Each memory cell 112 includes a passgate transistor 114 having its gate connected to word line 140, its drain connected to bit line 150, and its source connected to capacitor 116. The layout of the memory cell 112 is typical of that of a DRAM memory cell. Each word line 140 is driven by a word line driver 145 and each bit line 150 is driven by a bit line driver 155.

Row decoder 160 and column decoder 170 decode address signals on address lines 161 to access memory cells 112. Data may be provided to memory cells 112 via data input path 182 and may be retrieved from memory cells 112 via data output path 184. The data being transmitted to and from data input 182 and data output 184 may be carried on data lines 180.

Word line driver 145 may be controlled by driver control circuitry 165. Control circuitry 165 receives signals from row decoder 160 that indicate which word line drivers 145 apply activation voltages and which word line drivers 145 apply deactivation voltages to word lines 140. The signal provided by control circuitry 165 to word line driver 145 is referred to herein as a decoded signal, DOUT.

When DOUT is HIGH (e.g., a logic state HIGH), this instructs word line driver 145 to apply an activation voltage to the word line or word lines it is driving. The activation voltage (e.g., $V_{CC}$ or $V_{CCP}$) may be provided by high voltage source 190, which is connected to word line driver circuitry 145. An activation voltage is applied to word line 140 to perform a memory access function (e.g., read or write function) on a particular memory cell 112. The activation voltage activates passgate transistor 114 to enable data transfer between memory cell 112 and data paths 182 and 184.

When no memory access function is being performed (e.g., standby mode), word line driver 145 may apply a deactivation voltage to word line 140. The deactivation voltage (e.g., a ground voltage or a negative voltage) may be provided by low voltage source 192, which is connected to word line driver 145. The application of a deactivation voltage turns passgate transistor 114 OFF, thereby preventing any memory access function from being performed on memory cell 112.

Figure 2:
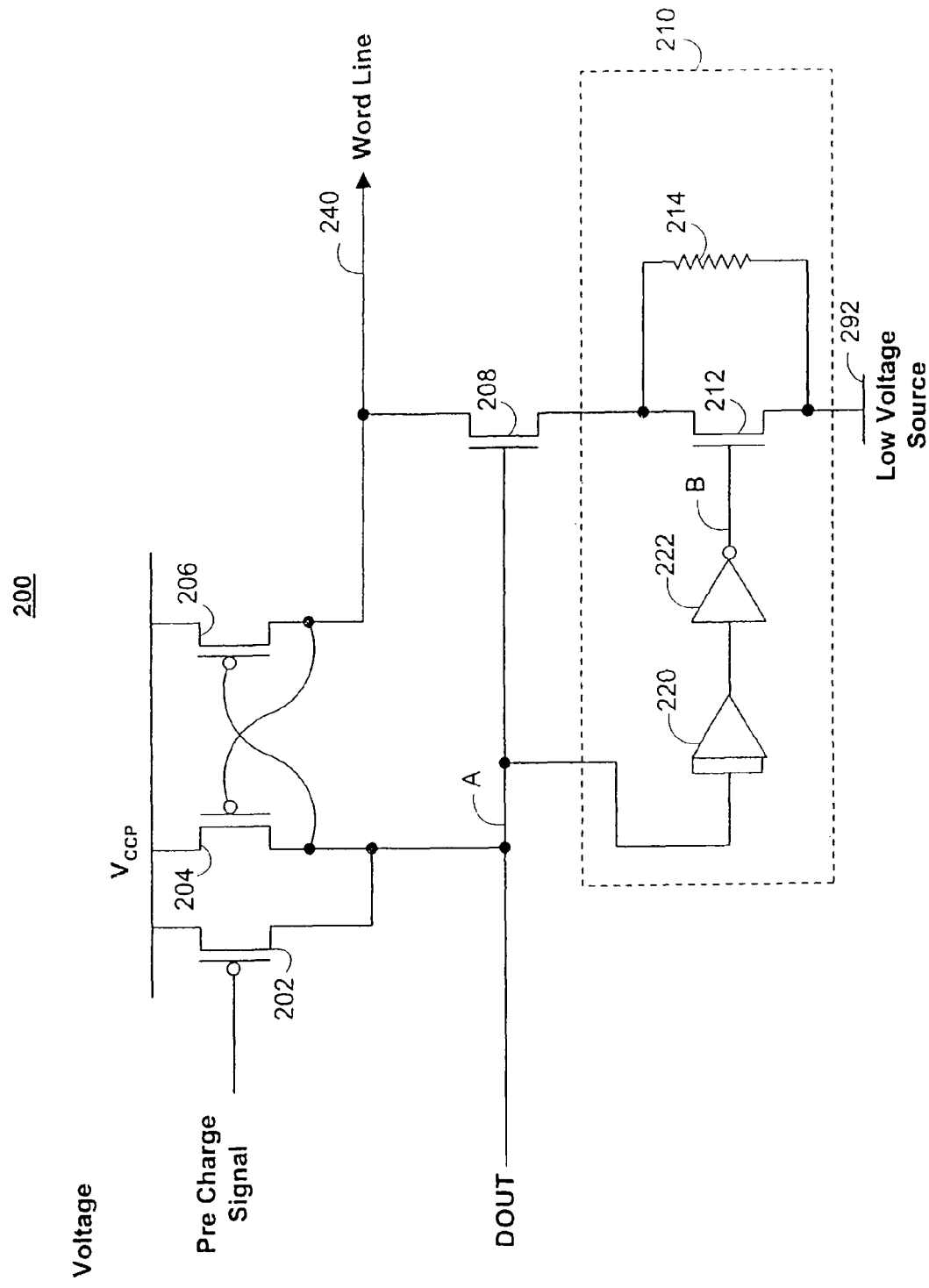
FIG. 2 is a schematic diagram of a word line driver according to the invention.

FIG. 2 is schematic of a word line driver that may be used, for example, as word line driver 145 of FIG. 1 that is in accordance with the principles of the present invention. Word line driver 200 includes PMOS transistor 202, which has its gate coupled to control circuitry (not shown), its source coupled to $V_{CCP}$, and its drain coupled to the gate of a NMOS transistor 208 and the gate of PMOS transistor 206. The sources of PMOS transistors 204 and 206 are coupled to $V_{CCP}$. The gate of PMOS transistor 204 is coupled to the drain of PMOS transistor 206. The drain of PMOS transistor 206 is coupled to wordline 240 and to the drain of NMOS transistor 208.

The source of NMOS transistor 208 is coupled to the drain of NMOS transistor 212. The gate of NMOS transistor 208 is coupled to receive DOUT, a signal provided by control circuitry (not shown) that indicates whether the word line is to be driven HIGH or LOW. The node connected to the drains of PMOS transistors 202 and 204, the gate of NMOS transistor 208 and the input of delay stage 222 is referred to herein as Node A. DOUT is coupled to the input of delay stage 220, which has its output coupled to the input of inverter 222. The output of inverter 222 (Node B) is coupled to the gate of NMOS transistor 212. The output of inverter 222 provides a time delayed complement of DOUT, referred to herein as DOUT_BAR. The source of NMOS transistor 212 is coupled to low voltage source 292. The cathode of resistor 214 is coupled to the drain of NMOS 212 and its anode is coupled to the source of NMOS 212 and low voltage source 292.

NMOS transistor 212, high impedance circuitry 214, delay stage 220, and inverter 222 are part of current-limiting protection circuitry 210, as indicated by the dashed lined box in FIG. 2. Circuitry 210 functions to limit leakage current in the event of short circuits between word lines (e.g., row-to-row short circuits and row-to-row column short circuits), reduces bounce on the LOW voltage bus, and decreases the response time for driving the voltage on the wordline from a HIGH voltage to a LOW voltage.

In addition to DOUT and DOUT_BAR, other signals may be used to assist word line driver circuitry 200 in driving the word line. For example, in the word line driver embodiment shown in FIG. 2, a precharge (PC) signal is applied to the gate of PMOS transistor 202. The PC signal may be provided by driver control circuitry (not shown) and is applied to assist word line driver 200 in pulling the voltage on Node A HIGH.

Figure 3:
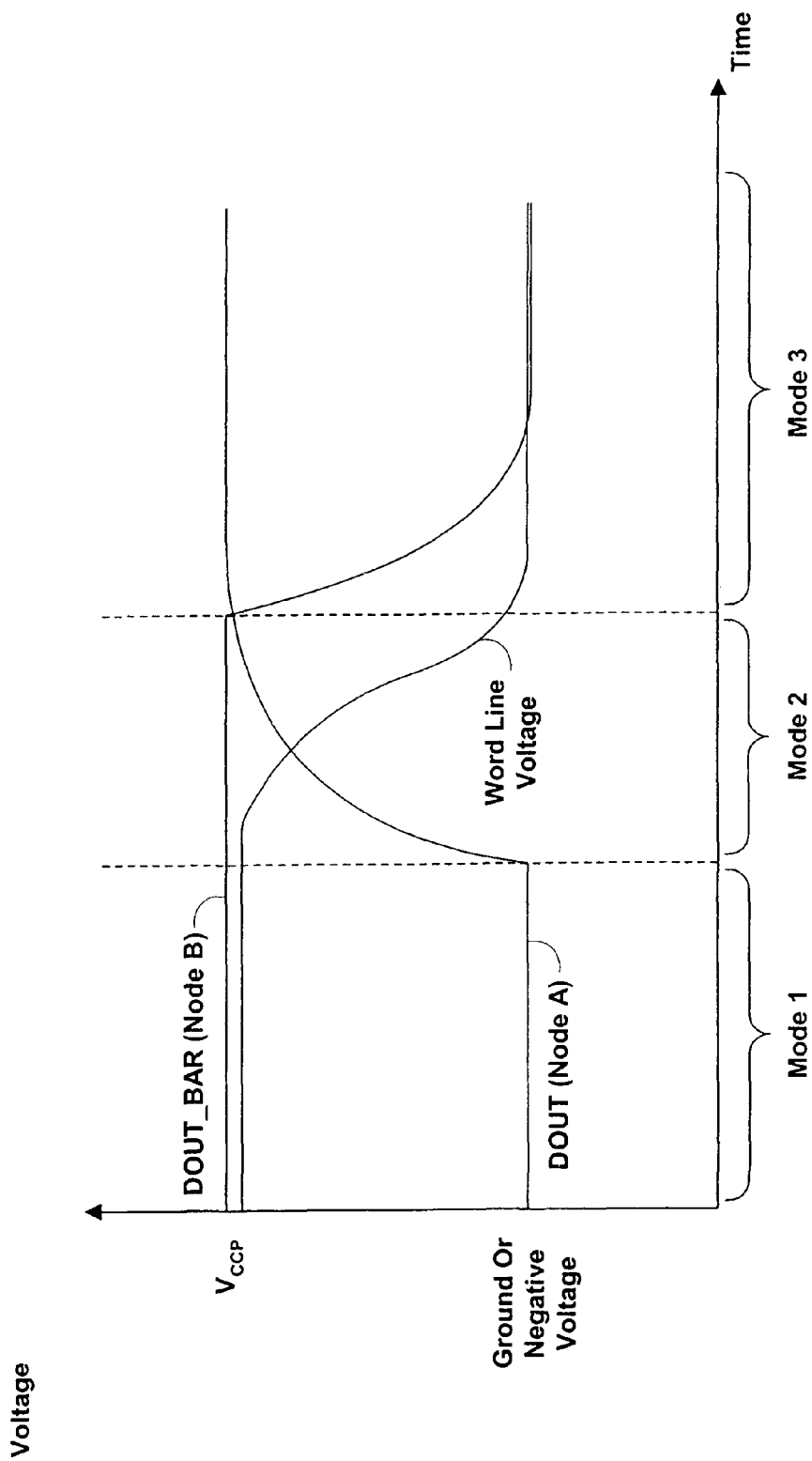
FIG. 3 is a graph showing several voltage waveforms present at various nodes of word line driver circuitry according to the invention.

Operation of word line driver 200 is now described with reference to the timing diagram of FIG. 3. FIG. 3 shows voltage waveforms of DOUT (Node A), DOUT_BAR (Node B), and the word line voltage as the state of DOUT transitions from LOW-to-HIGH. In addition, FIG. 3 illustrates three modes of operation of word line driver 200.

When DOUT is LOW and DOUT_BAR is HIGH, the word line is HIGH. When the states of DOUT and DOUT_BAR are such, word line driver 200 operates according to a first mode of operation and selects a first current path for driving word line 240 HIGH. A LOW DOUT activates PMOS 206 and deactivates NMOS 208. Note that when DOUT is LOW, the PC signal is HIGH. A HIGH PC signal ensures that PMOS transistor 202 is turned OFF. When PMOS 206 is ON, word line 240 is pulled up to $V_{CCP}$. DOUT_BAR is HIGH and causes NMOS transistor 212 to be turned ON. Although NMOS 212 is ON, low voltage source 292 is not coupled to wordline 240 because NMOS 208 is OFF. Transistor 204 is turned OFF because the voltage on word line 240 is HIGH. Thus, the first current path includes supplying the activation voltage (from $V_{CCP}$) to word line 240 via PMOS transistor 206.

When DOUT switches from LOW-to-HIGH, this marks the start of a second mode of operation in which a second current path is selected to rapidly pull down the word line voltage to a LOW voltage. In FIG. 3, mode 2 is delineated by the two dashed vertical lines. At the start of mode 2, DOUT begins to transition from LOW-to-HIGH. To assist in pulling DOUT HIGH, the PC signal goes LOW to "jump start" the pull down of the word line. More particularly, when the PC signal goes LOW, PMOS transistor 202 turns ON, thereby pulling Node A up to $V_{CCP}$. As Node A is pulled up, this causes PMOS transistor 206 to turn OFF, preventing $V_{CCP}$ from supplying voltage to word line 240.

Also, as Node A goes HIGH, NMOS transistor 208 is turned ON. Once ON, a pathway connecting word line 240 to low voltage source 292 is provided because both NMOS transistors 208 and 212 are ON. Note that NMOS 212 is ON for a predetermined period of time (which is set by delay stage 220) even though the voltage at Node A is HIGH. This delay is shown in FIG. 3, in which the voltage at Node B remains HIGH for a predetermined period of time before going LOW. It is during this predetermined period of time that the voltage on word line 240 is rapidly driven to a LOW voltage (e.g., a deactivation voltage). Thus, the second current path couples word line 240 to low voltage source 292 via transistors 208 and 212.

The voltage on word line 240 is rapidly pulled down when both NMOS transistors 208 and 212 are ON because a relatively low resistance pathway is provided. In addition, the time delay set by delay stage 220 is sufficient to enable the voltage on word line 240 to be pulled down to a LOW voltage, without having to rely too heavily on pulling the word line voltage down through high impedance circuitry 214. Any remaining voltage on the word line may be pulled down via high impedance circuitry 214 (e.g., resistor) when transistor 212 turns OFF.

After the predetermined period of time expires, DOUT_BAR goes LOW while DOUT remains HIGH. This represents a third mode of operation in which word line driver 200 selects a third current path. The third current path couples word line 240 to low voltage source 292 via high impedance circuitry 214 and NMOS transistor 208. When DOUT is HIGH and DOUT_BAR is LOW, NMOS transistor 212 is OFF and NMOS transistor 208 is ON. Thus, any current present on word line 240 is forced to pass through high impedance circuitry 214 to low voltage source 292. Accordingly, current flow on word line 240 is limited to the quantity of current that can pass through impedance circuitry 214. If desired, the impedance of impedance circuitry 214 may be sufficient (e.g., 1M Ohm) to limit current flow to a few microamps. Furthermore, impedance circuitry 214 prevents the voltage at node C (formed between transistors 208 and 214) from floating.

The advantages of the invention are realized by the combination of current protection circuitry 210 and the dual transistor arrangement of transistors 208 and 212. The dual transistor arrangement provides advantageous sizing of NMOS transistor 212 to promote rapid discharge of word line 240. That is, the size of NMOS transistor 212 can be increased to accommodate larger current flows while at the same time minimizing leakage current. As is known in the art, a larger transistor can conduct more current, which results in faster pull down of the word line voltage during mode 1 operation.

This flexibility in sizing transistor 212 extends to the time delay as set by delay stage 220. The time delay set by delay stage 220 may depend on the size of transistor 212. As a consequence, a tradeoff exists between the ability to discharge the word line and the size of transistor 212. To promote word line discharge, it is desirable to extend the time delay. However, as the time delay is extended, larger transistors may be required. Since the dual transistor configuration promotes use of a larger transistors, this creates a synergism that enhances the operation of the word line driver circuitry according to the invention.

The combination of current-limiting protection circuitry 210 and the dual transistor arrangement limits leakage current, including leakage current caused by short circuit conditions on the word lines, while maintaining the ability to rapidly pull down the word line voltage. The inverter in current protection circuitry 210 forces transistor 212 to be OFF when transistor 208 is ON, absent the period of time in which both transistors are either ON or OFF. Forcing one transistor to be OFF when the other is ON is effective in limiting current flow because the current is not provided with a low resistance path to low voltage source 292.

For example, when word line 240 is HIGH, transistor 208 is OFF and transistor 212 is ON. Leakage current is limited because the current is not permitted to pass through transistor 208 because it is operating like an "open" circuit. When word line 240 is LOW, transistor 208 is ON and transistor 212 is OFF. Leakage current is limited to the amount of current that can flow through high impedance circuitry 214 because transistor 212 is operating like an "open" circuit. Thus, in the event of a short between, for example, two word lines or a word line and a bit line, impedance circuitry 214 limits the current flow, thereby effectively reducing leakage current and preventing potentially damaging current from damaging memory circuitry or other circuitry.

It is understood that the circuitry arrangement shown in FIG. 2 is not the only arrangement that may be used to benefit from the advantages of the invention. Particularly, with respect to transistors 202, 204, and 206, different transistor arrangements may be implemented to route signals such as DOUT and the PC signal. In fact, use of the PC signal can be eliminated using a different arrangement. In addition, $V_{CCP}$ may be routed to the word line using a different circuitry arrangement.

Figure 4:
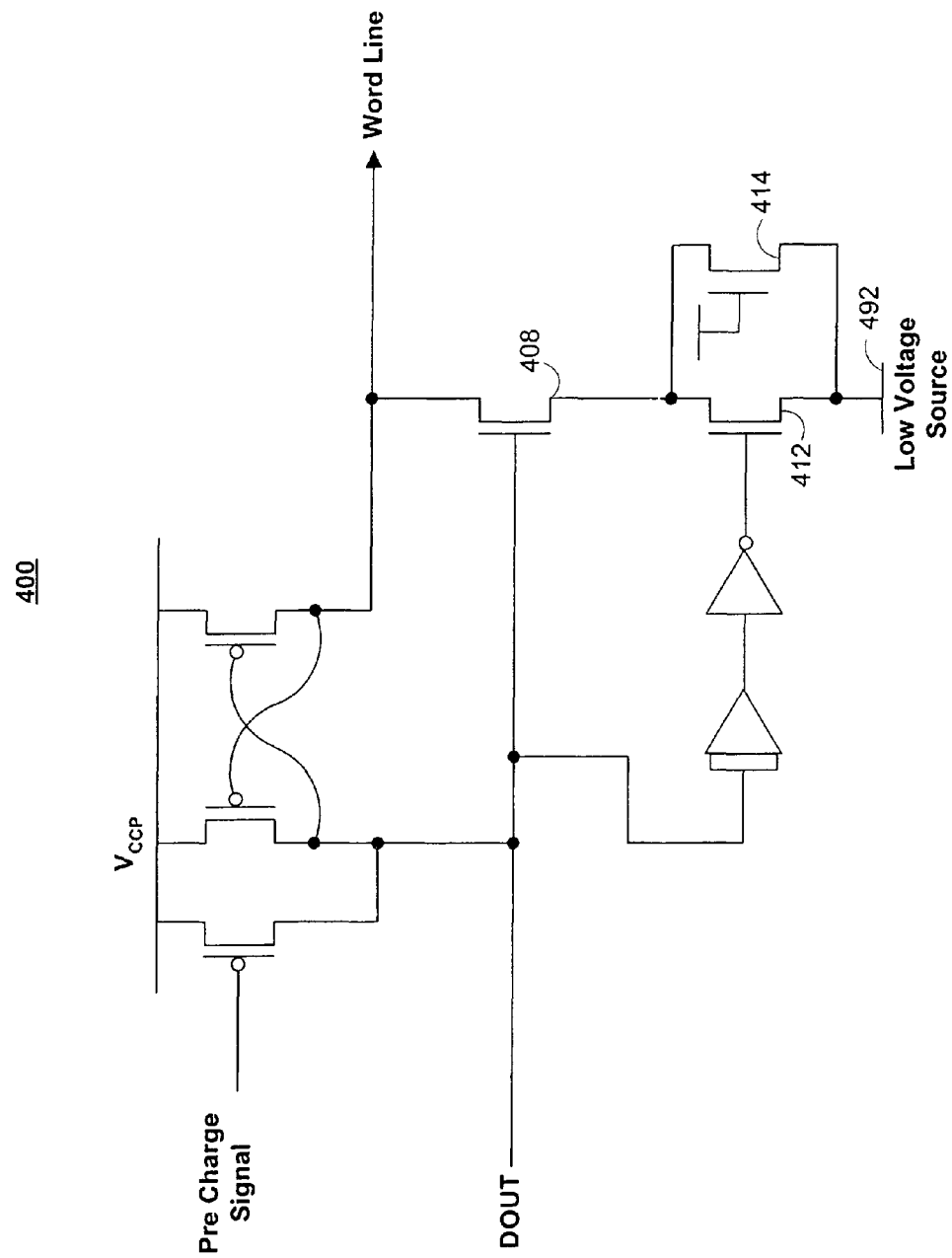
FIG. 4 is a schematic diagram of an alternative word line driver circuitry according to the invention.
Figure 5:
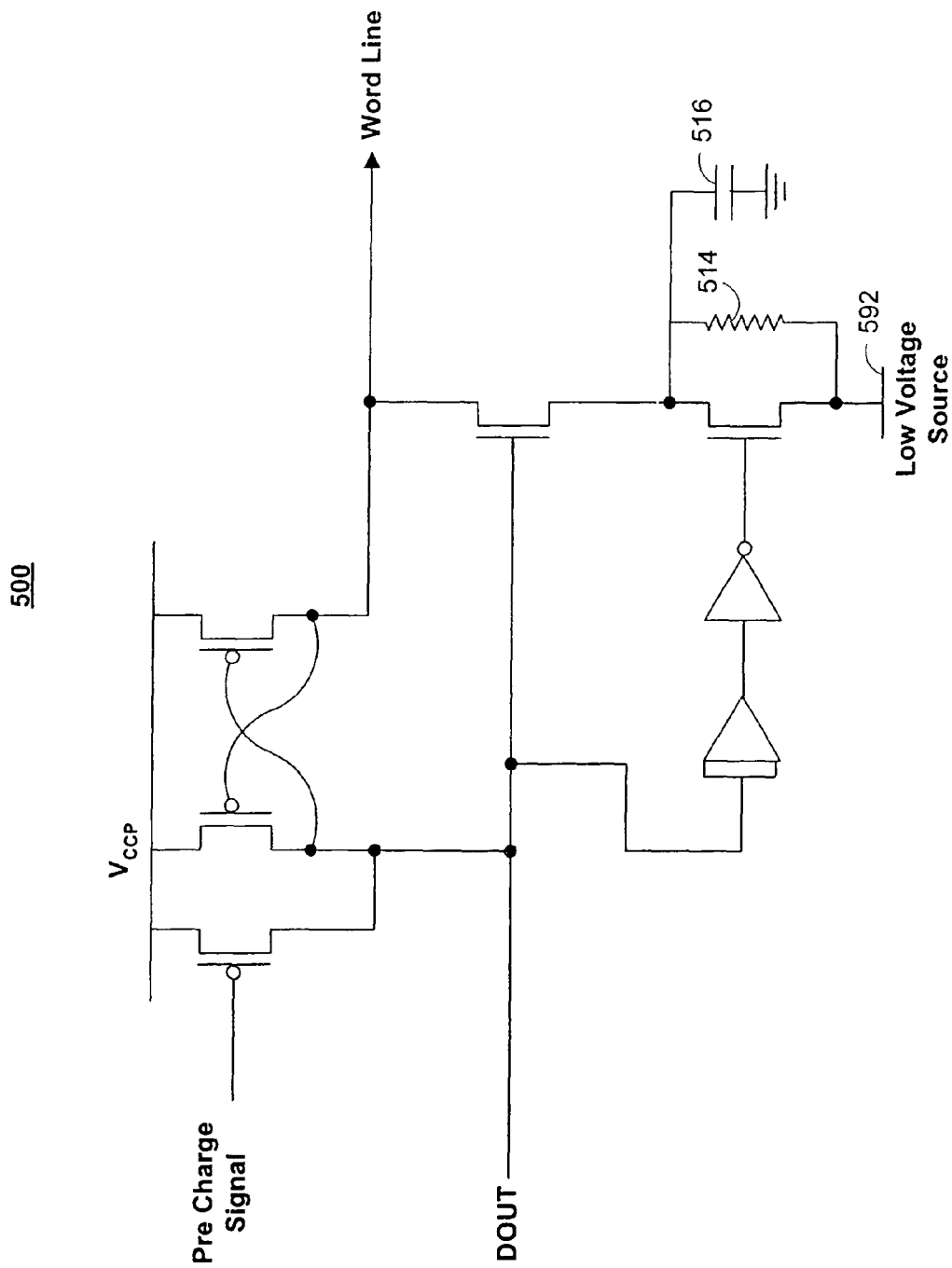
FIG. 5 is a schematic diagram of yet another alternative word line driver circuitry according to the invention.

FIGS. 4 and 5 show alternative embodiments of word line drivers that are in accordance with the principles of the present invention. These alternative embodiments illustrate different types of high impedance circuitry configurations. Word line driver 400 of FIG. 4 shows an NMOS transistor 414 having its drain coupled to the node formed between the source of NMOS transistor 408 and the drain of NMOS transistor 412, its gate coupled to ground, and its source coupled to low voltage source 492. NMOS transistor 414 is configured to operate in cutoff mode, which causes transistor 414 to operate as a current-limiting device.

Word line driver 500 of FIG. 5 shows the word line driver of FIG. 2, except that capacitor 516 is coupled to the cathode of resistor 514. Capacitor 516 may help stabilize or negate voltage bounce on low voltage source 592 when the word line is being pulled down. As is known in the art, a bounce in the voltage being provided by low voltage source 592 can occur when the word line switches from an ON state to an OFF state. This bounce is a positive voltage that can cause a memory cell to lose voltage, potentially causing the memory cell to lose its data. The presence of capacitor 516 supplies instantaneous current to low voltage source 592 through transistor 512 when the word line is being driven LOW.

Figure 6:
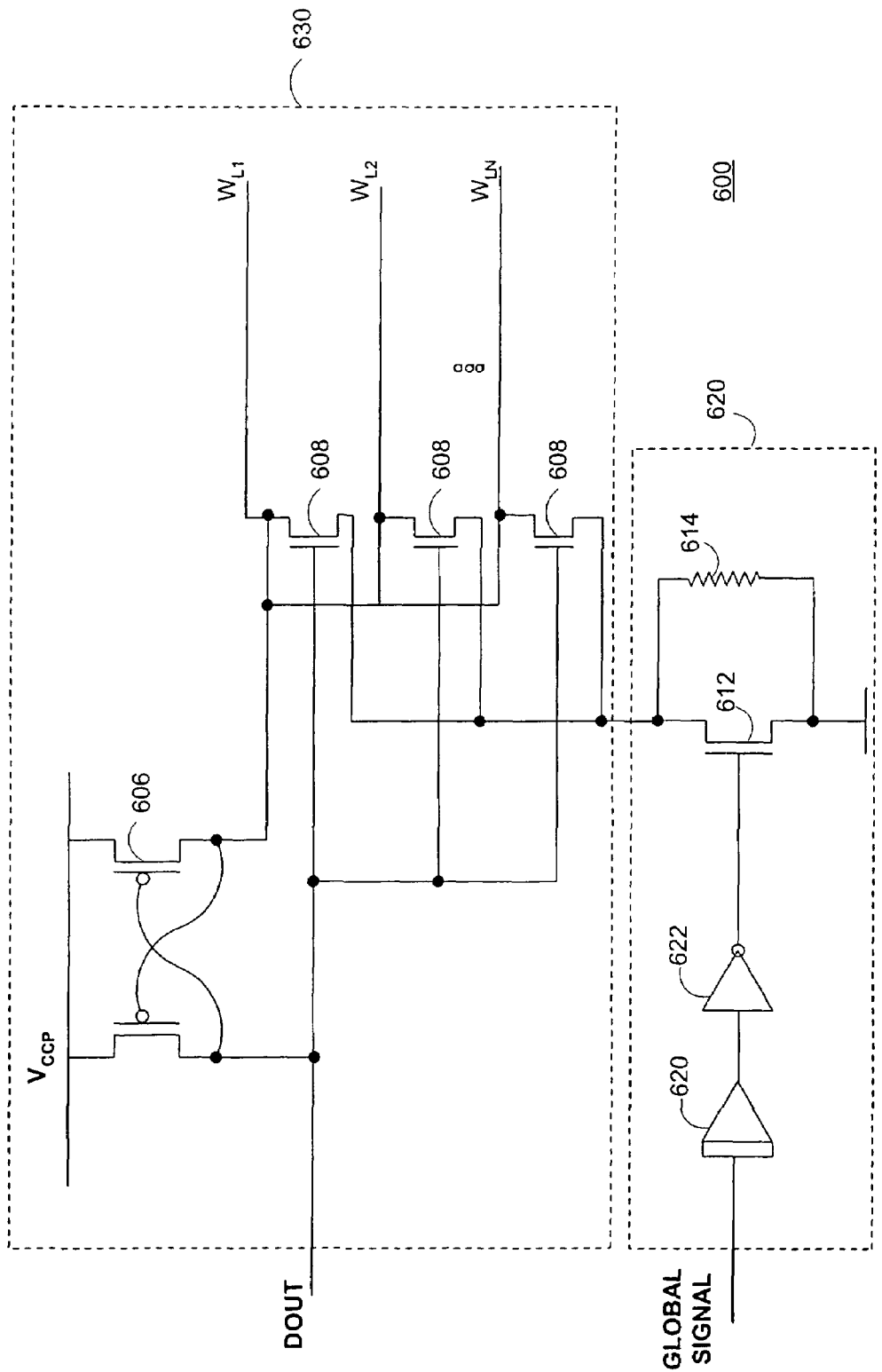
FIG. 6 is a schematic diagram of word line driver circuitry that is driving a plurality of word lines according to the invention.

FIG. 6 shows circuitry in accordance with the invention that is being used to protect multiple word lines. This embodiment includes current-limiting protection circuitry, as delimited by dashed box 620, and memory segment 630. A memory segment 630 represents a "large" portion of memory and each memory segment 630 has a predetermined number of memory cells. FIG. 6 shows memory segment 630 having multiple word lines ranging from 1 to N. Thus, one word line driver is able to drive each of word lines 1 to N.

The circuitry in this embodiment is disposed in memory segment 630 and current-limiting protection circuitry 620. Associated with each word line is a NMOS transistor 608 that has its drain coupled to the drain of PMOS transistor 606 and to its associated word line, its gate coupled to receive DOUT, and its source coupled to the drain of the NMOS transistor 612. Protection circuitry 620 includes NMOS transistor 612 and high impedance circuitry 614, delay stage 620, which receives GLOBAL SIGNAL, and inverter 622, which drives NMOS transistor 612.

Current-limiting protection circuitry 620 is disposed separate from the word lines in memory segment 630. For example, current-limiting protection circuitry 620 may be disposed in a free cell. One advantage of separating protection circuitry 620 from memory segment 630 is that it decreases the die size needed to construct the word lines. That is, less die space is needed because there no need to accommodate current-limiting protection circuitry 620 in each word line.

Another advantage of using current-limiting protection circuitry 620 in connection with one or more word lines is that it promotes use of a larger NMOS transistor 612 than that if only one word line is connected to current protection circuitry 620. This is possible because of the capacitance resulting from the interconnection of the multiple word lines. As is known in the art, a larger transistor typically conducts more current and has a larger blocking voltage than its smaller counterparts.

Current-limiting protection circuitry 620 may be controlled by a GLOBAL SIGNAL. GLOBAL SIGNAL may be a signal generated by driver control circuitry (not shown) or from another suitable source. During word line driver operation, GLOBAL SIGNAL transitions in conjunction with a transition in DOUT. Thus, when DOUT goes HIGH, GLOBAL SIGNAL goes HIGH.

The operation of circuitry 600 is similar to that as described above in connection with FIG. 2. GLOBAL SIGNAL is delayed for a predetermined period of time by delay stage 622 inverted by inverter 622, and applied to the gate of NMOS transistor 612. It is during this delay when both transistors 608 and 612 are ON that each of the word lines are driven to a LOW voltage.

When the time delay expires, transistor 612 turns OFF. Once OFF, current-limiting circuitry 620 protects against short circuits that may occur on the word lines by limiting the current flow with high impedance circuitry 614 (shown here as a resistor). It is understood that impedance circuitry 614 may embody different circuitry such as that shown in FIGS. 4 and 5.

The word line driver of the present invention enables testing of faulty word lines without resulting in the destruction of the memory cells associated with word lines that are faulty. Preservation of faulty word lines is a byproduct of the dual transistor arrangement and the high impedance circuitry.

It will be understood that the foregoing drain and source orientation and drain and source orientation of the transistors described herein is not intended to be limiting, but merely illustrative of one way such transistors can be constructed. Therefore, the terms "source" and "drain" are to be interpreted in their broadest sense.

Figure 7:
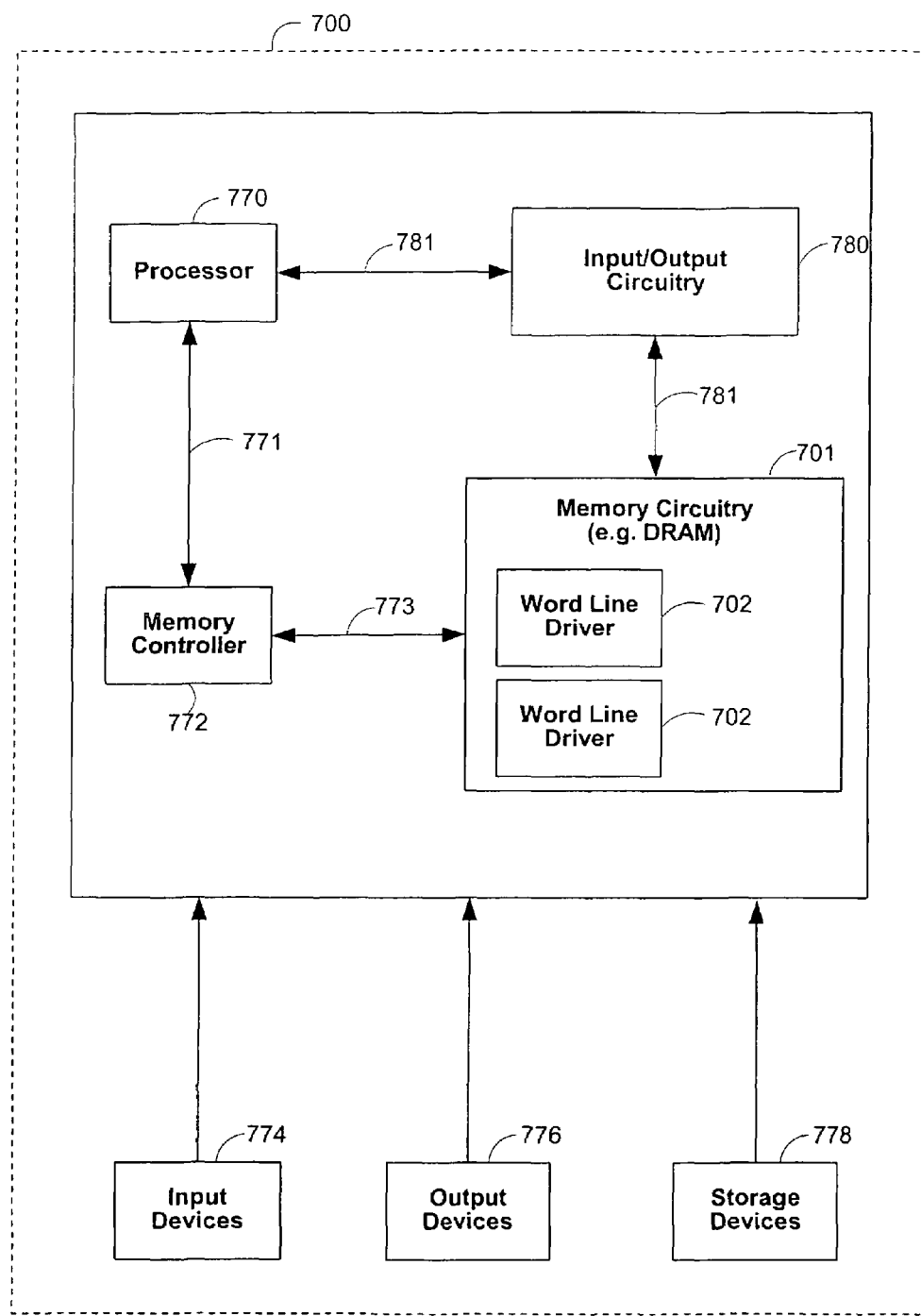
FIG. 7 is a block diagram of an illustrative system that incorporates the invention.

FIG. 7 shows a system that incorporates the invention. System 700 includes memory circuitry 701 (e.g., DRAM), a processor 770, a memory controller 772, input devices 774, output devices 776, and optional storage devices 778. Word line driver circuitry 702 according to the invention may be used, for example, to drive and pull down word lines in the memory circuitry 701. For example, memory controller 772 may provide signals (e.g., address signals) that cause word line driver circuitry 702 to access certain memory cells in memory circuitry 701. Control signals may be transferred between processor 770 and memory controller 772 via bus 771. Data may be transferred between processor 770 and memory circuitry 701 via data input/output circuitry 780 on bus 781. Similarly, data and control signals are transferred between memory controller 772 and memory circuitry 701 via bus 773. Input devices 774 can include, for example, a keyboard, a mouse, a touch-pad display screen, or any other appropriate device that allows a user to enter information into system 700. Output devices 776 can include, for example, a video display unit, a printer, or any other appropriate device capable of providing output data to a user. Note that input devices 774 and output devices 776 can alternatively be a single input/output device. Storage devices 778 can include, for example, one or more disk or tape drives.

Thus, word line driver circuitry that provides rapid pull down while limiting leakage current in short-circuit conditions on word lines is provided. One skilled in the art will appreciate that the present invention can be practiced by other than the described embodiments, which are presented for the purposes of illustration and not of limitation, and the present invention is limited only by the claims which follow.

What is claimed is:

1. Integrated circuitry, comprising:
   a first word line; and
   a word line driver coupled to said word line and coupled to receive a signal, DOUT, that causes said word line driver to drive voltage on said first word line between a HIGH voltage and a LOW voltage, said word line driver comprising:
      current-limiting protection circuitry operative to prevent current on said first word line from exceeding a predetermined current level while said word line voltage is LOW, wherein said current-limiting protection circuitry utilizes a low impedance current path for a predetermined period of time after said first word line transitions to said LOW voltage.

2. The integrated circuitry defined in claim 1, wherein said predetermined period of time is set by a delay stage.

3. The integrated circuitry defined in claim 1, wherein said current-limiting protection circuitry utilizes a high impedance path when said predetermined period of time expires.

4. The integrated circuitry defined in claim 1, comprising:
   a memory segment that includes a plurality of word lines, said first word line being one of said plurality of word lines, wherein said word line driver is coupled to each one of said plurality of word lines in said memory segment.

5. The integrated circuitry defined in claim 4, wherein said current-limiting protection circuitry is coupled to receive a GLOBAL SIGNAL that selectively activates said current-limiting protection circuitry.

6. The integrated circuitry defined in claim 4, wherein said current-limiting protection circuitry is disposed in said integrated circuitry but separate from said memory segment.

7. Integrated circuitry, comprising:
   control circuitry coupled to a word line, and coupled to receive signals DOUT and DOUT_BAR, DOUT_BAR being a delayed complement of DOUT, wherein said integrated circuitry is operative to drive voltage on said word line between a HIGH voltage and a LOW voltage in response to the states of DOUT and DOUT_BAR.

8. The integrated circuitry defined in claim 7, wherein said integrated circuitry selects a first current path to drive said word line voltage HIGH when the state of DOUT is LOW.

9. The integrated circuitry defined in claim 7, wherein said integrated circuitry selects a second current path to drive the voltage of said word line LOW when the states of DOUT and DOUT_BAR are HIGH.

10. The integrated circuitry defined in claim 9, wherein DOUT and DOUT_BAR have the same state for a predetermined period of time.

11. The integrated circuitry defined in claim 7, wherein said integrated circuitry selects a third current path to limit potential leakage current present on said word line when the state of DOUT is HIGH and the state of DOUT_BAR is LOW.

12. Integrated circuitry, comprising:
   a high voltage source;
   a low voltage source; and
   word line driver circuitry coupled to said high and low voltage sources and to a word line, and operative to receive a first signal, wherein said word line driver circuitry comprises:
      a first transistor coupled to said word line, and
      precharge circuitry, wherein said precharge circuitry is coupled to receive a precharge signal, to said high voltage source, and to said first transistor, and is operative to assist said first signal in activating said first transistor.

13. The integrated circuitry defined in claim 12, wherein said word line driver circuitry is operative to selectively couple said word line to said high voltage source in response to said first signal, to couple said word line to said low voltage source in response to a second signal, and to couple said word line to said low voltage source but through an alternative coupling arrangement in response to a third signal.

14. The integrated circuitry defined in claim 13, wherein said second signal is asserted only for a predetermined period of time.

15. The integrated circuitry defined in claim 13, comprising:
   high impedance circuitry coupled to a connection between said first transistor, to a second transistor coupled to said first transistor, and to said low voltage source, wherein said third signal activates said first transistor and deactivates said second transistor such that said high impedance circuitry limits current flow in said word line.

16. The integrated circuitry defined in claim 13, wherein said word line driver circuitry is coupled to at least a second word line and is operative to drive the voltage on said second word line in response to said first, second, and third signals.

17. The integrated circuitry defined in claim 12, comprising:
   high impedance circuitry coupled to said low voltage source, wherein said high impedance circuitry comprises a resistor.

18. The integrated circuitry defined in claim 12, comprising:
   high impedance circuitry coupled to said low voltage source, wherein said high impedance circuitry comprises a transistor operating in a cutoff mode.

19. A method for driving a word line, the method comprising:
   receiving a signal DOUT that indicates whether a word line is to be activated;
   generating a delayed complement of DOUT, DOUT_BAR; and
   selecting a current path to drive the voltage on said word line between an activation voltage and a deactivation voltage, said selecting being based on the states of DOUT and DOUT_BAR.

20. The method defined in claim 19, comprising selecting a first current path to drive the voltage on said word line to said activation voltage when the state of DOUT is LOW.

21. The method defined in claim 19, comprising selecting a second current path to pull the voltage on said at least one word line to said deactivation voltage when the states of DOUT and DOUT_BAR are both HIGH.

22. The method defined in claim 19, comprising selecting a current-limiting path that minimizes leakage current on said word line when said word line is deactivated.

23. The method defined in claim 22, wherein said current-limiting path is selected when DOUT is HIGH and DOUT_BAR is LOW.

24. The method defined in claim 19 further comprising accessing at least one memory cell when said word line is activated.

25. The method defined in claim 19, wherein said generating comprises:
   delaying DOUT for a predetermined period of time; and
   inverting said delayed DOUT to provide DOUT_BAR.

26. The integrated circuitry defined in claim 1, wherein the word line driver comprises a first transistor coupled to said first word line, said first transistor being selectively activated by DOUT.

27. The integrated circuitry defined in claim 26, wherein said current limiting protection circuitry comprises:
- a second transistor coupled to said first transistor and a low voltage source, said second transistor providing the low impedance current path for driving said first word line down to said LOW voltage when said second transistor is turned ON.

28. The integrated circuitry defined in claim 27, wherein said current limiting protection circuitry comprises:
- high impedance circuitry coupled to a node formed between said first and second transistors and said low voltage source, said high impedance circuitry providing a high impedance current path that limits leakage current on said word line when said first word line is pulled LOW.

29. The integrated circuitry defined in claim 28, wherein said high impedance circuitry comprises a resistor.

30. The integrated circuitry defined in claim 29, wherein said high impedance circuitry further comprises a capacitor coupled to the resistor.

31. The integrated circuitry defined in claim 28, wherein said high impedance circuitry comprises a third transistor operating in a cutoff mode.

32. The integrated circuitry defined in claim 1, wherein said word line driver is coupled to receive a second signal DOUT_BAR, which is a delayed complement of DOUT, and said word line driver is operative to drive the voltage on said first word line between said HIGH voltage and said LOW voltage in response to the states of DOUT and DOUT_BAR.

33. The integrated circuitry defined in claim 32, wherein said word line driver circuitry selects a first current path to drive said voltage on said first word line HIGH when the state of DOUT is LOW.

34. The integrated circuitry defined in claim 32, wherein said word line driver circuitry selects a second current path to drive the voltage of said first word line LOW when the states of DOUT and DOUT_BAR are HIGH.

35. The integrated circuitry defined in claim 32, wherein said word line driver circuitry selects a third current path to limit potential leakage current present on said first word line when the state of DOUT is HIGH and the state of DOUT_BAR is LOW.

36. The integrated circuitry defined in claim 32, wherein DOUT and DOUT_BAR have the same state during the predetermined period of time.

* * * * *

UNITED STATES PATENT AND TRADEMARK OFFICE
CERTIFICATE OF CORRECTION

PATENT NO. : 7,764,567 B2  Page 1 of 1
APPLICATION NO. : 12/077852
DATED : July 27, 2010
INVENTOR(S) : Hirokazu Ueda It is certified that error appears in the above-identified patent and that said Letters Patent is hereby corrected as shown below:

Title Page;

On the face page, in field (75), in "Inventor", in column 1, line 1, delete "Uedo," and insert -- Ueda, --, therefor.

On the face page, in field (73), in "Assignee", in column 1, line 1, delete "IA" and insert -- ID --, therefor.

Signed and Sealed this

Twenty-eighth Day of September, 2010

David J. Kappos
*Director of the United States Patent and Trademark Office*